United States Patent
Frium

(10) Patent No.: US 9,030,261 B2
(45) Date of Patent: May 12, 2015

(54) TWO MODE POWER CONVERTER FOR AUDIO AMPLIFIERS

(75) Inventor: Mads Peter Frium, Allerod (DK)

(73) Assignee: Bang & Olufsen Icepower A/S, Lyngby (DK)

( * ) Notice: Subject to any disclaimer, the term of this patent is extended or adjusted under 35 U.S.C. 154(b) by 72 days.

(21) Appl. No.: 14/115,371

(22) PCT Filed: Jun. 14, 2012

(86) PCT No.: PCT/EP2012/061334
§ 371 (c)(1),
(2), (4) Date: Nov. 4, 2013

(87) PCT Pub. No.: WO2012/172007
PCT Pub. Date: Dec. 20, 2012

(65) Prior Publication Data
US 2014/0077885 A1    Mar. 20, 2014

(30) Foreign Application Priority Data
Jun. 15, 2011    (EP) ..................................... 11170024

(51) Int. Cl.
*H03F 3/04*        (2006.01)
*H02M 3/335*       (2006.01)
*H03F 3/217*       (2006.01)
*H02M 1/00*        (2006.01)

(52) U.S. Cl.
CPC ...... *H02M 3/33576* (2013.01); *H02M 3/33569* (2013.01); *H03F 3/217* (2013.01); *H02M 2001/0058* (2013.01); *Y02B 70/1491* (2013.01); *H03F 3/2173* (2013.01)

(58) Field of Classification Search
USPC .............................. 330/297, 127, 251, 207 A
IPC ......................................................... H03F 3/04
See application file for complete search history.

(56) References Cited

U.S. PATENT DOCUMENTS

| 5,903,138 | A  | * | 5/1999  | Hwang et al. ................. 323/266 |
| 5,982,639 | A  | * | 11/1999 | Balakirshnan ............. 363/21.18 |
| 7,944,296 | B1 | * | 5/2011  | Lee et al. ..................... 330/195 |
| 8,760,228 | B2 | * | 6/2014  | Khlat ........................ 330/124 R |
| 2004/0145930 | A1 | | 7/2004  | Noro |
| 2005/0017803 | A1 | * | 1/2005  | Jonkman ....................... 330/251 |
| 2009/0309658 | A1 | | 12/2009 | Mendenhall |
| 2011/0305049 | A1 | * | 12/2011 | Raptis et al. .................... 363/34 |

FOREIGN PATENT DOCUMENTS

WO    WO2007/096761    8/2007

OTHER PUBLICATIONS

International Search Report from PCT/EP2012/061334 (now WO 2012/172007); dated Oct. 5, 2012; The instant application is a national phase of PCT/EP2012/061334; 3 pages.

* cited by examiner

*Primary Examiner* — Patricia T Nguyen
(74) *Attorney, Agent, or Firm* — Harness, Dickey & Pierce, P.L.C.

(57) ABSTRACT

A power converter with positive and negative supply rail outputs for feeding a single ended class D amplifier, the converter comprising a transformer arrangement, a supply pump reduction arrangement connected between the secondary windings and the positive and negative supply rail outputs, and a boost drive mode switching arrangement. A controller is adapted to control the power converter in a negate drive mode and a boost drive mode, wherein the output voltage in the boost mode is increased by means of the transformer and the boost drive mode switching arrangement. The output voltages on the positive and negative rails can be generated at two different output voltage levels without changing the duty cycle or dead time of the control signals.

9 Claims, 3 Drawing Sheets

TWO MODE POWER CONVERTER FOR AUDIO AMPLIFIERS

CROSS REFERENCE TO RELATED APPLICATIONS

This patent application is a U.S. national stage filing under 35 U.S.C. §371 of International Application No. PCT/EP2012/061334 filed Jun. 14, 2012 (published as WO 2012/172007 on Dec. 20, 2012), which claims priority of European application No. 11170024.1 filed Jun. 15, 2011 (published as EP2536014 on Dec. 19, 2012). The disclosures of the applications identified in this paragraph are incorporated herein by reference in their entirety.

TECHNICAL FIELD

This invention relates to a power converter for a single-ended class-D amplifier. According to one embodiment, the power converter may also be used for a full bridge class D amplifier.

TECHNICAL BACKGROUND

The two predominant topologies, known in prior art, and used for class-D amplifiers are the full-bridge- and the half-bridge topology.

For low cost consumer products the half-bridge topology has a distinct advantage over the full-bridge since only half the number of power switches, drivers and output inductors is needed. Even though the voltage rating of the power switches is doubled in the half-bridge topology, there is still a manufacturing and cost benefit due to the reduction of number of components. Since the speaker output terminals are referenced to ground, overload protection and output sensing becomes easier compared to the full-bridge topology.

The drawback of the half-bridge class-D topology is the need for a dual rail supply and the fact that this topology will pump current back to the opposite supply rail from where the power is being drained.

This problem is described in some detail in U.S. 2004/0145930, which is directed to a solution based on rectifiers in parallel with controlled switches.

A more efficient solution to the rail pumping problem is disclosed in US application 2009/0102295, assigned to the same assignee of the present invention. By this solution, the advantages of using a single-ended class D amplifier in consumer products have been made practically available.

The consumer product market requires very efficient audio amplifiers with a high output power which at the same time consumes as little power as possible.

SUMMARY OF THE INVENTION

It is an object of the present invention to provide a power supply for use with a class D amplifier, which power supply has improved efficiency, in particular when the class-D amplifier is idling or delivering only low output power.

According to a first aspect of the present invention, this and other objects are achieved by a power conversion system according to claim 1.

The positive and negative rail outputs can advantageously be used to drive a single ended class D amplifier. The switching arrangement and the controller enable two different drive modes, so that the output voltages on the positive and negative rails can be generated at two different output voltage levels without changing the duty cycle or dead time of the control signals.

The selection of the one or another two different output levels can be made according to the amplifier voltage demanded by the front-end digital sound processor. As a consequence, the power supply according to the present invention offers a great efficiency improvement for the total audio power solution during idle and at low output power.

The two drive modes may further be used to provide maximum voltage regulation without changing the switching frequency or dead-time.

The system is preferable arranged to run in resonant mode with zero voltage/zero current switching, by providing resonant tank capacitors, and by suitably selecting the switching frequency and dead time. By actively eliminating or reducing the supply pumping the need for large rail capacitors can be avoided thus improving system compactness and supply quality which inherently will lead to better audio performance. This embodiment of the invention thus enables all the benefits of the single-ended amplifier structure without introducing the classical problems that arises with the rail pumping phenomena. The pump reduction preferably occurs continuously cycle by cycle.

Because the maximum voltage regulation can be achieved without changing the frequency or dead time of the control signals, it is possible to maintain zero voltage zero current switching also during regulation.

According to one embodiment, the power supply includes additional switches to provide an additional output. This output can be used to supply a full bridge class-D amplifier.

It should be noted that according to a second aspect of the present invention, the converter does not include the positive and negative supply rail outputs, but only has a single supply rail output. In this case, the converter is thus intended to drive only a full bridge amplifier.

BRIEF DESCRIPTION OF THE DRAWINGS

The present invention will be described in more detail with reference to the appended drawings, showing currently preferred embodiments of the invention.

DETAILED DESCRIPTION OF PREFERRED EMBODIMENTS

Figure 1:
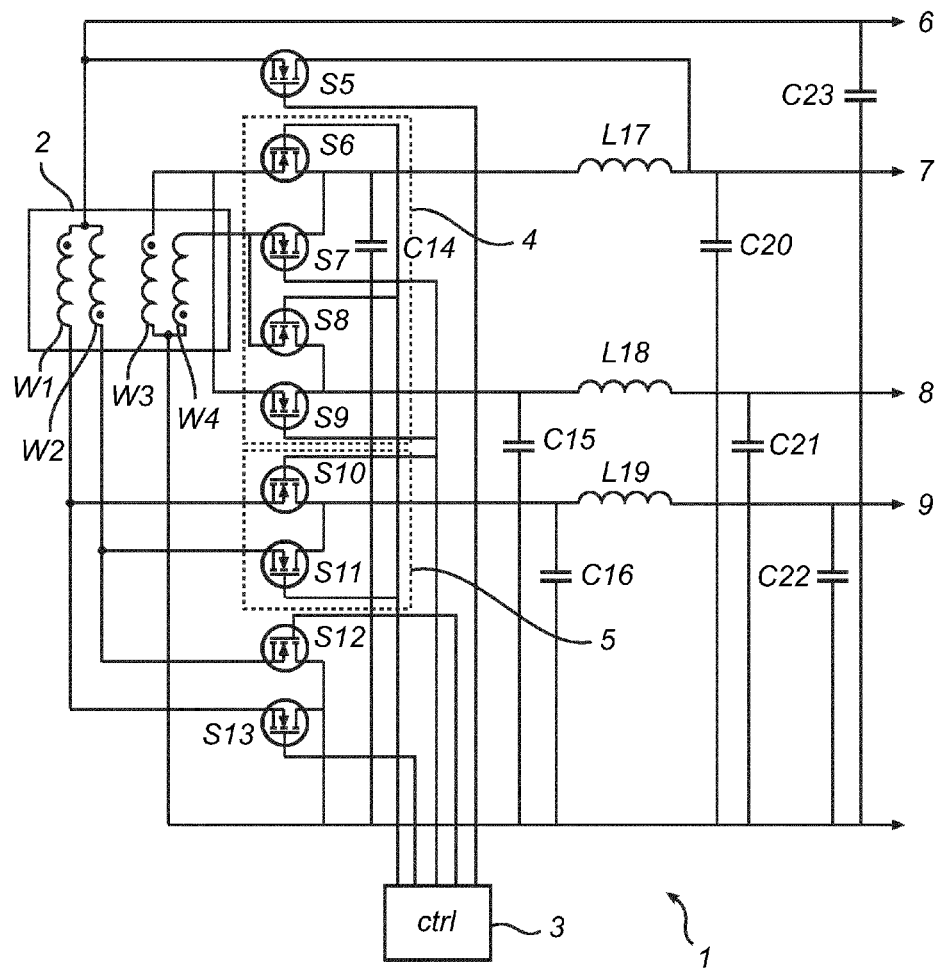
FIG. 1 is a block diagram of an embodiment of the present invention.
Figure 2:
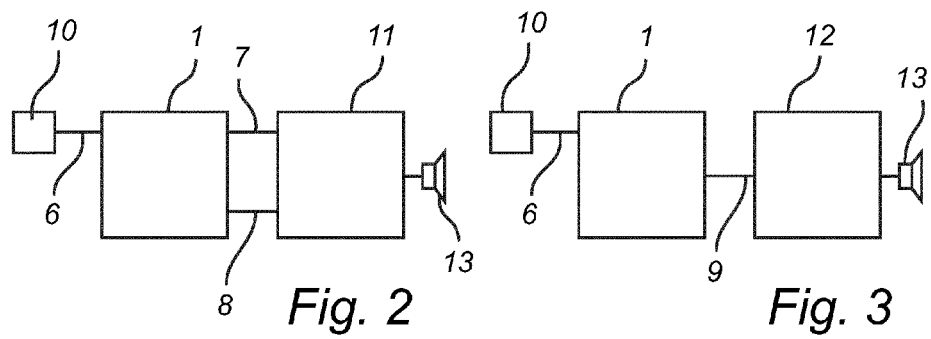
FIG. 2 is a block diagram of a converter in FIG. 1 connected to a single ended class D amplifier.
Figure 3:
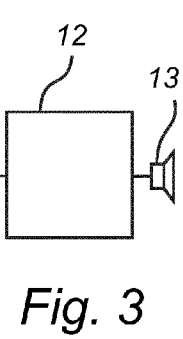
FIG. 3 is a block diagram of a converter in FIG. 1 connected to a full bridge class D amplifier.

A block diagram of a power converter according to an embodiment of the present invention is shown in FIG. 1. The converter has a power supply input 6, connected to a power source 10 (see FIGS. 2 and 3). The output of the power source 10 is a DC-voltage (or almost) which means that in case of an AC-source input, means to rectify and stabilize the voltage is included in the source 10, as well as means for safety insulation between the mains and the output. In the illustrated case the power source 10 is a DC battery (e.g. automotive, portable equipment), such as a 12 V battery. The converter further has a positive supply rail output 7 and a negative supply rail output 8, intended to driving a single ended class D amplifier 11 (see FIG. 2). In the illustrated embodiment the converter also has a single supply rail output 9, intended for driving a full bridge class D amplifier 12 (see FIG. 3).

The class D amplifier may be used to drive a load 13 such as an electro dynamic loudspeaker but can be any kind of transducer transforming the electrical signal from the amplifier to an acoustic signal.

The converter here comprises a transformer arrangement 2 having two primary windings W1 and W2 and two secondary windings W3 and W4. The windings W1 and W2 have a first number of turns n1, while the windings W3 and W4 have a second number of turns n2. The transformer arrangement 2 can be implemented by a single magnetic structure. According to one embodiment, the transformer arrangement is a planar transformer where the windings are formed on a printed circuit board (PCB). This makes the leakage inductance predefined within very narrow tolerances, which is important for the resonant tank behaviour which will be discussed below.

Figure 4:
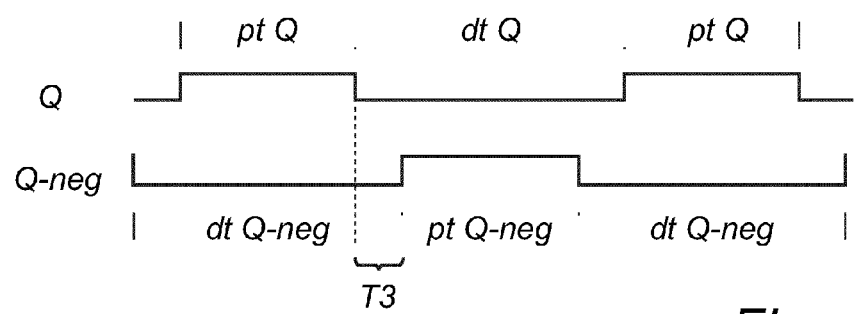
FIG. 4 is a diagram illustrating the first and second control signals, Q and Q-neg.

The converter in FIG. 1 has nine switches S5-S13, for example realized by MOSFET transistors. The simple drive pattern of the MOSFETs also enables a simple way to implement soft-switching techniques of the switches. The switches are controlled by a controller 3. The controller applies two control signals in the form of complementary square wave pulse trains, Q and Q-neg (see FIG. 4). The control signals have a fixed pulse time (pt) and dead time (dt).

Four of the switches, S6-S9, form a supply pump reduction arrangement 4 connected between the positive and negative supply rails and the secondary windings. This arrangement redistributes any pumping charge from a single ended class D-amplifier 11 connected to the converter 1 (see FIG. 2) by forcing current flow from the rail with the highest voltage to the rail with the lowest voltage. The pump reduction action occurs continuously cycle by cycle of the control signals Q and Qneg.

The supply pump reduction arrangement 4 works as a Supply Rail Mirror (SRM) which basically mirrors the voltage of the numerical smallest value to the other rail at any given time. In case of rail pumping, the SRM circuit will mirror the supply rails by redistributing the pumping charge in such a manner that supply rails will become essential equal numerically.

Such switching will effectively mirror the two supply rails onto each other. This has two distinct advantages. Firstly, any variation in the two rail voltages is equalized (pump canceling). Secondly, this circuit effectively utilizes the capacity of both rails which means that dynamic power delivered from the rail capacitors becomes equal to that utilized in a single rail supply with the same amount of capacity.

The positive supply rail output 7, the negative supply rail output 8 and the single rail output 9 are connected to ground via capacitors C14, C15 and C16, respectively. By choosing the value of C14, C15 and C16 so that these capacitors together with the leakage inductance of the transformer form a resonant tank, Zero Voltage/Zero current switching (ZVS/ZCS) can be obtained for all switches.

In some applications it is not possible to control the values of the capacitors C14-C16 to accommodate the resonant current transition. In such a case there may be provided a filter that separates the capacitors from the power supply rails in terms of high frequency influence. The separation is done by adding inductors L17-L19 between the resonant tank capacitors and the output capacitors C21, C22 and C23. In this way the HF behavior of the circuit and thereby the resonance frequency of the resonant tank formed by the capacitors C14-C16 and the leakage inductance can be controlled.

The power converter 1 can be driven in two different drive modes, referred to as negate drive mode and boost drive mode. For this purpose the converter has a drive mode switch S5 connected between the first common point and the positive supply rail 7, and a boost drive mode switching arrangement comprising a first boost switch S12 connected between a positive terminal of the second primary winding W2 and ground, and a second boost switch S13 connected between a negative terminal of the first primary winding W1 and ground.

The switches S5, S12 and S13 are selectively controlled by the controller to provide two different output voltage levels on the positive and negative supply rail outputs 7, 8. The difference is decided by the relationship between n1 and n2, as will be discussed in further detail below.

Negate Drive Mode

Drive mode switch S5 is set ON (closed) thereby connecting the power source 10 directly to the positive supply rail 7. Switches S6, S8 and S11 are driven by the Q pulse train, while S7, S9 and S10 are driven by the Q-neg pulse train. The supply voltage is now transformed by the transformer arrangement 2 to the negative supply rail output 8 having the same magnitude but reversed polarity.

This mode is referred to as the negation state where the positive supply rail is negated to form a negative supply rail to obtain a +/− voltage supply for a single ended class D amplifier.

At the same time the single supply rail output 9 is also provided with a voltage by the transformer arrangement 2. This voltage will have a magnitude $V_{single\ supply\ rail}=V_{source}+V_{positive\ rail}\times n1/n2$, i.e. $V_{source}\times(1+n1/n2)$. If n1=1 and n2=3 and the supply voltage is 12 V, the single supply rail output voltage will thus be 16 V.

The negate action is bi-directional which means that any supply pumping from a class D amplifier connected to the dual rail output 7, 8 will be redistributed to the opposite rail maintaining total rail balance regardless of load imbalance.

More specifically, when the control signals Q and Q-neg are applied to the transistors S6/S8 and S7/S9, respectively, the circuit will cancel the supply pumping by mirroring the two supply rails on to each other. In a first cycle, the transistors S6 and S8 will be turned ON. The positive supply rail across the capacitor C14 will then be put across the transformer winding w3. Likewise, the negative supply rail voltage on the capacitor C15 will be put across the transformer winding w4. Since the two windings are coupled to each other in a 1:1 ratio, any difference in the magnitude of the positive and negative rail voltage will cause a load current to migrate from the rail with the largest magnitude to the other rail. In the next cycle the same operation is performed but now with transistor S7 and S9 turned ON. This action secures the balancing of the transformer 1.

Figure 7:
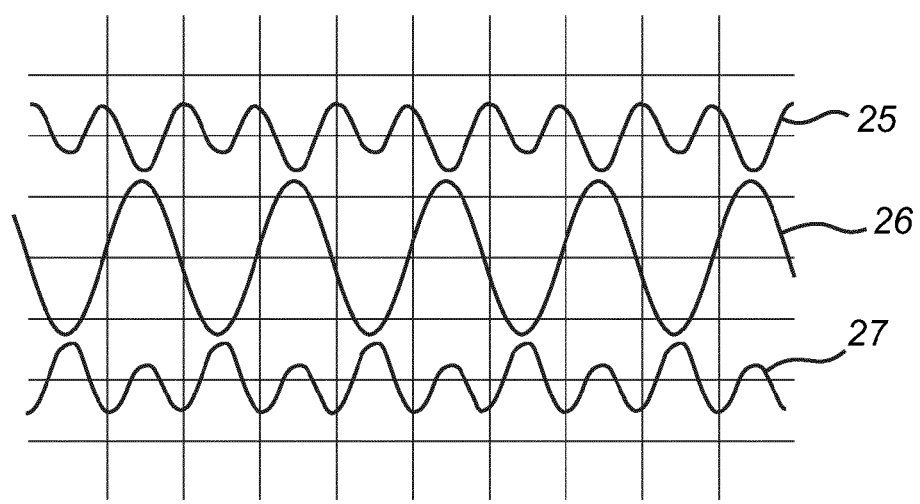
FIG. 7 is a diagram illustrating current pump cancelling.

The pump cancelling is further illustrated by FIG. 7, showing the output voltages of the supply rails in an experimental realization of the system in FIG. 1. In FIG. 7, curve 25 is the positive supply rail voltage, curve 27 is the negative supply rail output, and curve 26 is the output voltage swing across the amplifier load 13. From FIG. 7 it is clear to see that when the output voltage swing 26 is at its positive peak the positive supply rail 25 sacks due to the peak power consumption. Looking at the negative supply rail voltage 27 at the same point in time this also sacks. This is because energy is being transformed from the negative supply rail 8 to the positive supply rail 7 by coupling between the transformer 2 windings W4 and W3.

Boost Mode

In boost mode S5 is set OFF (open) and the controller 3 applies the pulse trains Q and Q-neg also to S12 and S13, respectively.

The source supply rail is now transformed to the positive and negative supply rail with a magnitude decided by the relationship between the number of turns n1 and n2. More specifically, the following holds:

$$V_{positive\ supply\ rail} = V_{source} \times n2/n1$$

$$V_{negativ\ supply\ rail} = -V_{source} \times n2/n1$$

Again assuming n1=1 and n2=3, this means that the positive and negative supply rails will be provided with triple the voltage from the source.

S6 and S7 acts as synchronous rectifiers for the positive supply rail and S8 and S9 acts as synchronous rectifiers for the negative supply rail.

Since these synchronous rectifiers are bi-directional any supply pumping from the class D amplifier occurring in boost-mode will be redistributed to the opposite rail via the transformer arrangement 4 which similar to the negate mode will maintain total rail balance regardless of load imbalance.

At the same time the single supply rail output is generated through the transformer arrangement, and will have a magnitude $V_{single\ supply\ rail} = V_{source} + V_{source} \times n1/n1 = 2 \times V_{source}$ Output Voltage Regulation In boost mode it is possible to limit the maximum output voltage of the power converter without changing duty cycle or dead time. During such maximum output regulation zero voltage, zero current switching and pump cancellation on the positive and negative supply rails are maintained.

Figure 5:
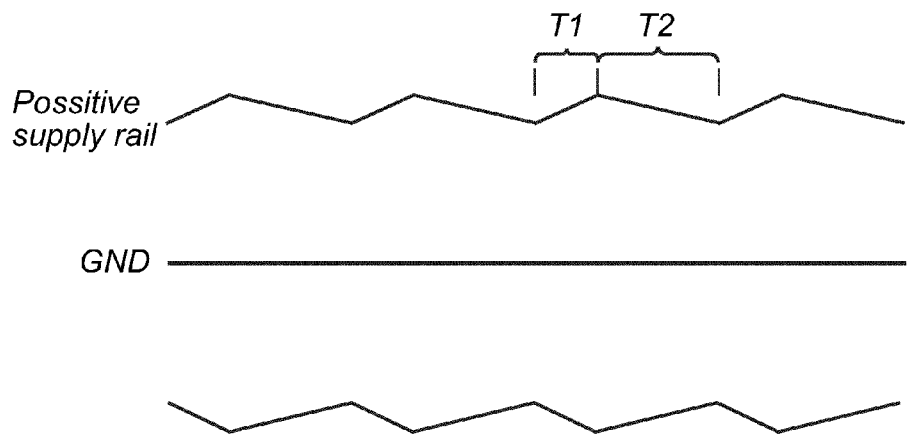
FIG. 5 is a diagram illustrating voltage regulation.

Since the output voltage is proportional to the input voltage multiplied by the turn ratio of the transformer arrangement n2/n1, the need for a maximum output voltage regulation will for most applications be preferable. Such regulation is illustrated in FIG. 5.

During a first period T1, the boost switches S12 and S13 are enabled, and are driven by the pulse trains Q and Qneg, respectively. As a consequence, the supply rail voltage increases with the charging of the output capacitors C20 and C22. At a predefined output voltage level the boost switches S12 and S13 are disabled, and during the following period T2 the output voltage will decrease with the discharging of the output capacitors. After a predefined voltage drop (hysteresis) the switches are again enabled and the voltage will rise to the predefined level and then turn off again. By enabling and disabling the switching of S12 and S13 in periods when both S12 and S13 are open, i.e. when both control signals Q and Q-neg have dead time (indicated by T3 in FIG. 4), the resonant zero current zero voltage switching can be maintained during regulation. The frequency of the turn on/off cycle will depend on load and the amount of output capacity.

Figure 6:
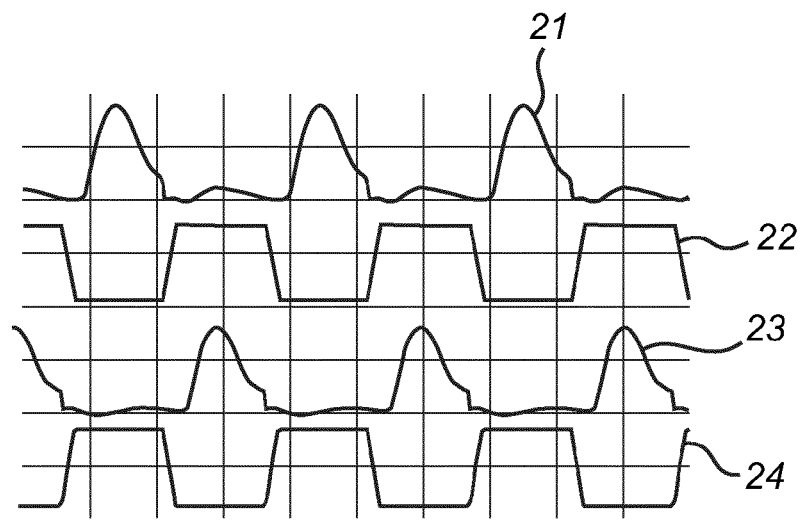
FIG. 6 is a diagram illustrating resonant switching.

FIG. 6 depicts current and voltage signals obtained at the drain of switches S12 and S13 in an experimental realization of the system in FIG. 1.

The system is here connected to a 160 W resistive load. In the figure, curve 21 is the current of the drain of the switch S12, curve 22 is the voltage of the drain of the switch S12, and curve 23 is the current of the drain of the switch S13, curve 24 is the voltage of the drain of the switch S13. The curves 21 and 23 illustrate the resonant sinusoidal current waveform obtained by the switches. It is noted that all curves are free of any high frequency ringing which makes the topology very beneficial from an EMI point of view, important in many implementations.

The system as disclosed may be applied in any consumer product including means to provide audio to a user; such as, but not limited to, audio/video systems, multimedia players, audio/video appliances in automobiles, in boats and alike.

The person skilled in the art realizes that the present invention by no means is limited to the preferred embodiments described above. On the contrary, many modifications and variations are possible within the scope of the appended claims. For example, the switches may be of other kind than MOSFETs. Also, the transformer arrangement does not need to be a planar transformer on a PCB, but may be of a conventional transformer design.

The invention claimed is:

1. A power converter comprising:
a DC power input,
a positive supply rail output,
a negative supply rail output,
a transformer arrangement having four windings, first and a second primary windings each having a first number of turns n1, and first and a second secondary windings each having a second number of turns n2, wherein a positive terminal of the first primary winding and a negative terminal of the second primary winding are connected to a first common point which is connected to the DC power input,
a supply pump reduction arrangement connected between the secondary windings and the positive and negative supply rail outputs and adapted to redistribute a pumping charge from a single ended class D amplifier connected to the positive and negative supply rail outputs by forcing a current flow from a supply rail output with a higher voltage to a supply rail output with a lower voltage,
a boost drive mode switching arrangement comprising a first boost switch connected between a positive terminal of the second primary winding and ground, and a second boost switch connected between a negative terminal of the first primary winding and ground,
a drive mode switch connected between the first common point and the positive supply rail, and
a controller adapted to control said power converter in a negate drive mode and a boost drive mode,
wherein, in said negate drive mode, said drive mode switch is set ON to connect said DC power input to said positive supply rail, and said first and second boost switches are set OFF to inactivate the first and second primary windings, and
wherein, in said boost drive mode, said drive mode switch is set OFF, and wherein a first control signal having ON-pulses of a predefined pulse time separated by a dead time is applied to said first boost switch, and a second control signal which is 180 degrees phase shifted with respect to the first control signal is applied to said second boost switch.

2. The power converter according to claim 1, wherein said supply pump reduction arrangement includes:
a first switch connected between the positive terminal of the first secondary winding and the positive supply rail output,
a second switch connected between the negative terminal of the second secondary winding and the positive supply rail,
a third switch connected between the negative terminal of the second secondary winding and the negative supply rail output, a fourth switch connected between the positive terminal of the first secondary winding and the negative supply rail output, and wherein said first control signal is applied to said first and third switches, and said second control signal is applied to said second and fourth switches.

3. The power converter according to claim 1, further comprising a single supply rail output, a first output switch connected between the negative terminal of the first primary winding and the single supply rail output, and a second output switch connected between the positive terminal of the second primary winding and the single supply rail output, wherein, in negate mode, said first control signal is applied also to said second output switch, and said second control signal is applied also to said first output switch.

4. The power converter according to claim 1, further comprising a first resonant tank capacitance connected between the positive supply rail output and ground, and a second resonant tank capacitance connected between the negative positive supply rail output and ground, said first and second resonant tank capacitances arranged to interact with a leakage inductance of the transformer arrangement to form a resonant tank, wherein said pulse time and said dead time are selected based on the resonance frequency of said resonant tank to ensure zero voltage switching and zero current switching.

5. The power converter according to claim 1, wherein the controller is adapted to select drive mode based on an external event.

6. The converter according to claim 5, wherein the external event is given by the status of a class D-amplifier connected to the converter.

7. The converter according to claim 1, wherein the transformer arrangement has a single magnetic core.

8. An amplifier system comprising a power converter according to claim 1 and a single ended class D amplifier connected to the positive and negative supply rail outputs.

9. An amplifier system comprising a power converter according to claim 3 and a full bridge class D amplifier connected to the single supply rail output.

* * * * *